(12) United States Patent
Yen

(10) Patent No.: US 11,018,228 B2
(45) Date of Patent: May 25, 2021

(54) SILICON CARBIDE SEMICONDUCTOR DEVICE

(71) Applicant: Fast SiC Semiconductor Incorporated, Hsinchu (TW)

(72) Inventor: Cheng-Tyng Yen, Hsinchu (TW)

(73) Assignee: FAST SIC SEMICONDUCTOR INCORPORATED, Hsinchu (TW)

(*) Notice: Subject to any disclaimer, the term of this patent is extended or adjusted under 35 U.S.C. 154(b) by 0 days.

(21) Appl. No.: 16/929,697

(22) Filed: Jul. 15, 2020

(65) Prior Publication Data
US 2021/0043736 A1 Feb. 11, 2021

Related U.S. Application Data

(60) Provisional application No. 62/883,663, filed on Aug. 7, 2019.

(51) Int. Cl.
*H01L 29/16* (2006.01)
*H01L 29/417* (2006.01)
(Continued)

(52) U.S. Cl.
CPC .... *H01L 29/1608* (2013.01); *H01L 29/41775* (2013.01); *H01L 29/7393* (2013.01); *H01L 29/808* (2013.01)

(58) Field of Classification Search
CPC ... H01L 27/092–0928; H01L 29/66477–6684; H01L 29/78–7926; H01L 29/1033–1054; H01L 29/20–2006; H01L 29/7813; H01L 29/7825; H01L 29/66613–66628; H01L 29/42336; H01L 29/42352; H01L 29/4236; H01L 29/42356; H01L 29/66734; H01L 29/66431; H01L 29/66462; H01L 29/7832; H01L 2924/13062; H01L 29/66901–66909; H01L 29/66916; H01L 29/1058; H01L 29/1066; H01L 29/66893–66924; H01L 29/8086; H01L 27/098; H01L 27/14679;
(Continued)

(56) References Cited

U.S. PATENT DOCUMENTS

2013/0126971 A1 5/2013 Arthur et al.
2015/0084066 A1* 3/2015 Banerjee ............ H01L 29/7827
257/77

(Continued)

*Primary Examiner* — Moin M Rahman
(74) *Attorney, Agent, or Firm* — Muncy, Geissler, Olds & Lowe, P.C.

(57) ABSTRACT

A silicon carbide semiconductor device includes a first doped region including a plurality of first leg portions, a plurality of body portions, and a plurality of first arm portions. The first leg portions are extending along a second direction, the body portions connect at least two of the first leg portions, and the first arm portions are extending along a first direction and connecting at least two of the first leg portions. A second doped region includes a plurality of second leg portions, a plurality of source portions, and a plurality of second arm portions. The second leg portions are extending along the second direction, the source portions are arranged in the body portions and connecting at least two of the second leg portions, and the second arm portions are extending along the first direction and connecting at least two of the second leg portions.

13 Claims, 13 Drawing Sheets

(51) Int. Cl.
*H01L 29/739* (2006.01)
*H01L 29/808* (2006.01)

(58) Field of Classification Search
CPC ........... H01L 29/1608; H01L 29/41775; H01L 29/808; H01L 29/7393; H01L 29/7812; H01L 29/66045; H01L 29/167; H01L 29/1602; H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886
See application file for complete search history.

(56) References Cited

U.S. PATENT DOCUMENTS

2015/0372088 A1   12/2015   Bolotnikov et al.
2019/0081136 A1   3/2019    Yen et al.

* cited by examiner

SILICON CARBIDE SEMICONDUCTOR DEVICE

CROSS REFERENCE TO RELATED APPLICATIONS

This application claims priority of U.S. Provisional Application No. 62/883,663 filed on Aug. 7, 2019 under 35 U.S.C. § 119(e), the entire contents of all of which are hereby incorporated by reference.

FIELD OF THE INVENTION

The disclosure relates to a semiconductor device and more particularly to a silicon carbide semiconductor device.

BACKGROUND OF THE INVENTION

Silicon carbide (SiC) as an emerging semiconductor material for power devices provides superior properties including high dielectric strength to the electric field and low intrinsic carrier concentration over conventional silicon (Si) power devices due to its wide band gap.

The high dielectric strength of SiC enables a theoretical drift layer unipolar specific on-resistance much lower beyond the limit of Si and the low intrinsic carrier concentration enables stable operation of SiC power devices at high temperatures.

However, the channel mobility of SiC MOS (metal-oxide-semiconductor) controlled devices including SiC power MOSFETs is low, and low channel mobility increases the channel resistance and as a result channel resistance usually accounts for a significant part of total on resistance of SiC MOSFETs. Therefore, how to improve the performance of the silicon carbide semiconductor device is the focus of attention of the relevant personnel in the field.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

An objective of the invention is to provide a silicon carbide semiconductor device, which can improve the performance of the silicon carbide semiconductor device.

In one embodiment of the present disclosure, a silicon carbide semiconductor device is provided. The silicon carbide semiconductor device includes a drift layer, a first doped region, a second doped region, a plurality of third doped regions, a gate insulator, a gate electrode, and a source electrode. The drift layer is disposed on a substrate, the drift layer has a first conductivity type and an upper surface, and the drift layer includes an active region. The first doped region has a second conductivity type opposite the first conductivity type and forms a plurality of first p-n junctions and a plurality of JFET regions with the drift layer. The first doped region includes a plurality of first leg portions, a plurality of body portions, and a plurality of first arm portions. The plurality of first arm portions are extending along a first direction and connecting at least two of the first leg portions, the plurality of first leg portions are extending along a second direction, and the plurality of body portions connect at least two of the first leg portions. The second doped region, disposed in the first doped region, has the first conductivity type and forms a plurality of second p-n junctions with the first doped region, a plurality of channel regions are defined between the first p-n junctions and the second p-n junctions along the upper surface, the second doped region includes a plurality of second leg portions, a plurality of source portions, and a plurality of second arm portions, the plurality of second leg portions are extending along the second direction, the plurality of source portions are arranged in the body portions and connecting at least two of the second leg portions, and the plurality of second arm portions are extending along the first direction and connecting at least two of the second leg portions. The plurality of third doped regions, disposed in the body portions, have the second conductivity type. The gate insulator is disposed on the upper surface, and the gate insulator extending over the plurality of JFET regions, the channel regions, and part of the second doped region. The gate electrode is contacting the gate insulator. The source electrode is contacting the source portions and the third doped regions.

In one embodiment, each of the first leg portions is connected to the plurality of body portions only on one side and connected to the plurality of first arm portions only on the other side.

In one embodiment, the third doped regions are disposed adjacent to the source portions in each of the body portions.

In one embodiment, the third doped regions include a plurality of sub-regions in some of the body portions, and the sub-regions are separated to each other.

In one embodiment, the third doped regions have a plurality of sizes, and the third doped regions are adjacent to the source portions in some of the body portions.

In one embodiment, the opposite sides of the first arm portions connecting to the same first leg portions are aligned to a same baseline.

In one embodiment, the gate electrode is not contacting the gate insulator above a part of the JFET regions.

In one embodiment, the drift layer further includes an upper portion and a lower portion, and the upper portion has a doping concentration higher than a doping concentration of the lower portion.

In one embodiment, the first doped region has a first maximum depth in the drift layer, and the first maximum depth is equal to or larger than half of a thickness of the drift layer.

In one embodiment, the third doped regions have a second maximum depth larger than the first maximum depth.

In one embodiment, a doping concentration of the first doped region close to the upper surface is lower than other portion of the first doped region.

In one embodiment, the substrate has the first conductivity type and the silicon carbide semiconductor device is arranged as a metal oxide semiconductor field effect transistor (MOSFET).

In one embodiment, the substrate has the second conductivity type and the silicon carbide semiconductor device is arranged as an insulated gate bipolar transistor (IGBT).

In one embodiment, a channel width density of the active region is higher than 0.2 $\mu m^{-1}$.

In the silicon carbide semiconductor device of the invention, by setting a first doped region including a plurality of first leg portions, a plurality of body portions, and a plurality of first arm portions, and a second doped region including a plurality of second leg portions, a plurality of source portions, and a plurality of second arm portions, the performance of the silicon carbide semiconductor device could be improved.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1:
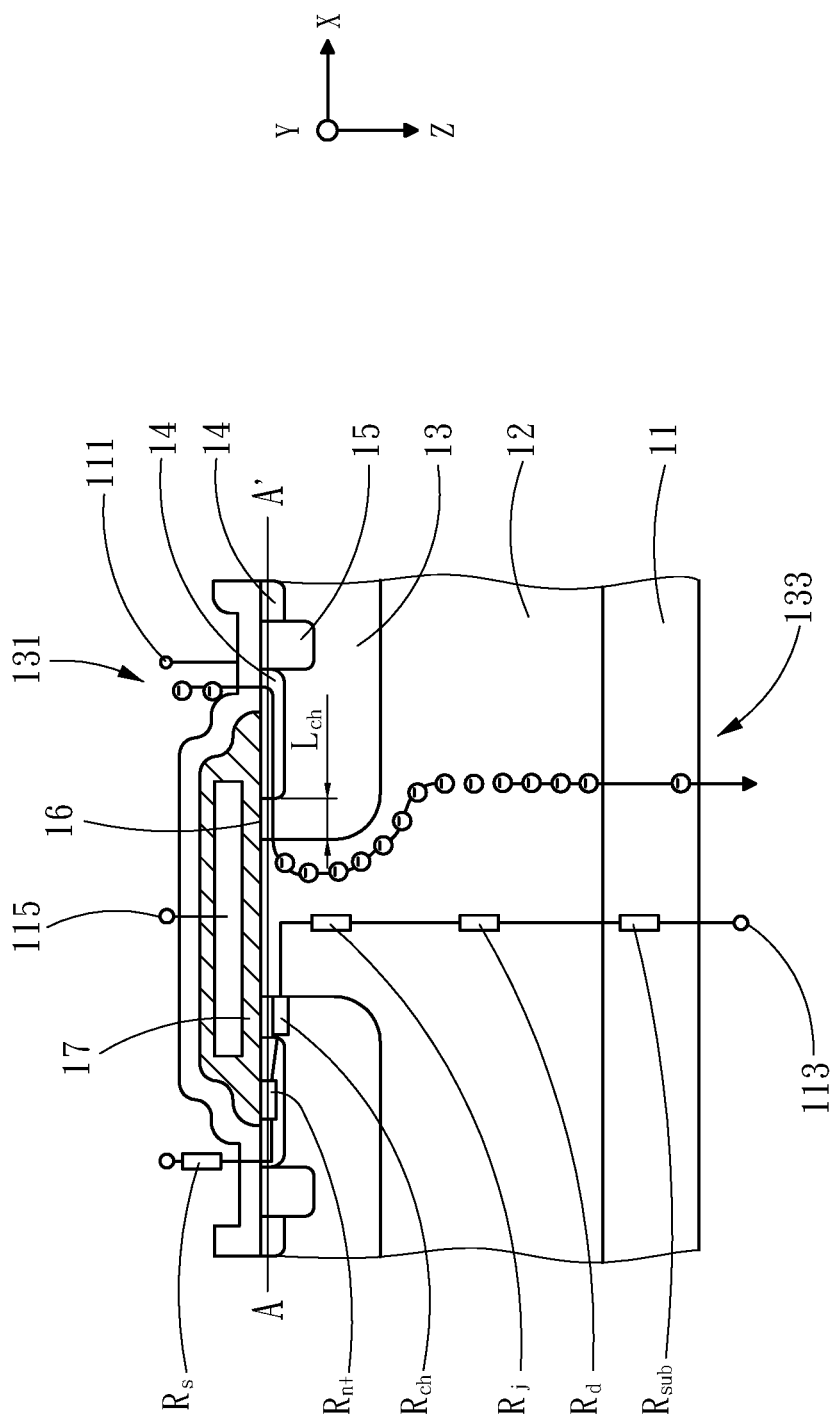
FIG. 1 is a cross-sectional view of a silicon carbide semiconductor device.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for simplicity and clarity and does not in itself dictate a relationship between the various embodiments and/or configurations discussed.

Furthermore, spatially relative terms, such as "over," "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented, and the spatially relative descriptors used herein may likewise be interpreted accordingly.

The terms "about," "approximately," and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about," "approximate," or "substantially."

Although some embodiments are discussed with steps performed in a particular order, these steps may be performed in another logical order. Some of the features described below can be replaced or eliminated for different embodiments. It is understandable that additional operations may be performed before, during, or after the method described, and that in other embodiments of the method, some of the operations may be substituted or omitted.

FIG. 1 is a cross-sectional view of a silicon carbide semiconductor device 1. Referring to FIG. 1, FIG. 1 is the cross-sectional view illustrating a cell in an active region of the n-channel planar silicon carbide semiconductor device 1.

Figure 2:
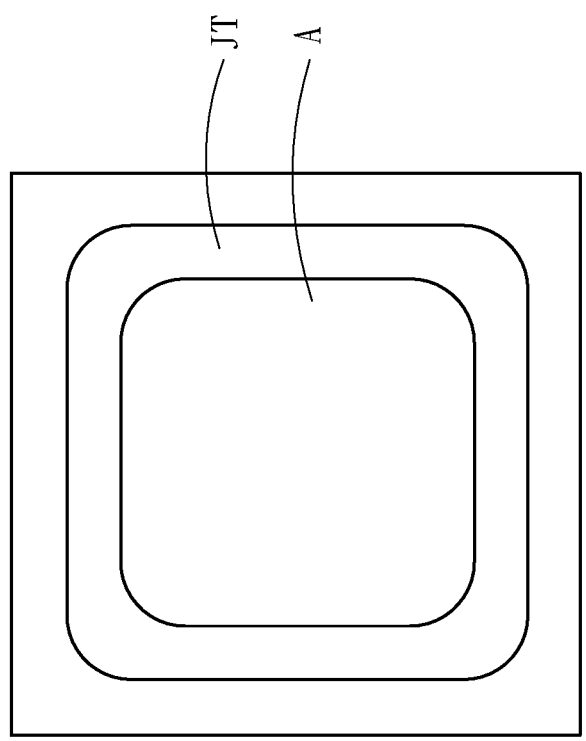
FIG. 2 shows an active region of a silicon carbide semiconductor device.

Also referring to FIG. 2, FIG. 2 shows an active region A of the silicon carbide semiconductor device 1. As illustrated in FIG. 2, the active region A is the region surrounded by a junction termination region (JT) such as p-type guard rings or junction termination extension (JTE). A plurality of the cell illustrated in FIG. 1 are arranged in the active region A and parallelly connected by a source electrode 111, a gate electrode 115, and a drain electrode 113 to provide the required functions.

The silicon carbide semiconductor device 1 of FIG. 1 includes a substrate 11, a drift layer 12, a pw (P-well) region 13, a n+ region 14, a p+ region 15, a channel region 16, a gate insulator 17, the source electrode 111, the drain electrode 113, and the gate electrode 115. The substrate 11 is heavily n-type (n+) doped. The drift layer 12 is lightly n-type (n−) doped. The pw region 13 is p-type doped and formed in the drift layer 12 adjoining to an upper surface 131 of the silicon carbide semiconductor device 1. The n+ region 14 is n-type doped. The p+ region 15 is p-type doped and adjacent to the n+ region 14. The channel region 16 with a channel length ($L_{ch}$) is defined by the pw region 13 and the n+ region 14. The gate insulator 17 is disposed on a portion of the upper surface 131. The gate electrode 115 is contacting the gate insulator 17. The source electrode 111 of the silicon carbide semiconductor device 1 is contacting the n+ region 14 and the p+ region 15. The drain electrode 113 is contacting a bottom 133 of the silicon carbide semiconductor device 1.

During operation, a gate-to-source voltage ($V_{GS}$) higher than a threshold voltage ($V_{th}$) is applied between the gate electrode 115 and the source electrode 111 to turn on the silicon carbide semiconductor device 1 by causing an inversion layer of the channel region 16 and enabling the conduction of electron currents from the source electrode 111 to the drain electrode 113. As shown in equation 1, the total drain-to-source on-resistance $R_{DS(on)}$ can be expressed as the sum of series resistances presenting on the path of electron currents:

$$R_{DS(on)} = R_s + R_{n+} + R_{ch} + R_j + R_d + R_{sub} \quad \text{(equation 1)}$$

In equation 1, $R_s$ is the source contact resistance, $R_{n+}$ is the source resistance of n+ region, $R_{ch}$ is the channel resistance, $R_j$ is the JFET resistance, $R_d$ is the drift layer resistance, and $R_{sub}$ is the substrate resistance.

The channel resistance $R_{ch}$ can further be written as shown in equation 2.

$$R_{ch} = \frac{L_{ch}}{W_{ch}} \frac{1}{\mu_n C_{ox}(V_{GS} - V_{th})} \quad \text{(equation 2)}$$

In equation 2, $W_{ch}$ is the channel width, $\mu_n$ is the channel mobility, $C_{ox}$ is the oxide capacitance. According to equation 2, reducing both channel length $L_{ch}$ and increasing channel width $W_{ch}$ can be used to reduce the channel resistance $R_{ch}$.

Figure 3:
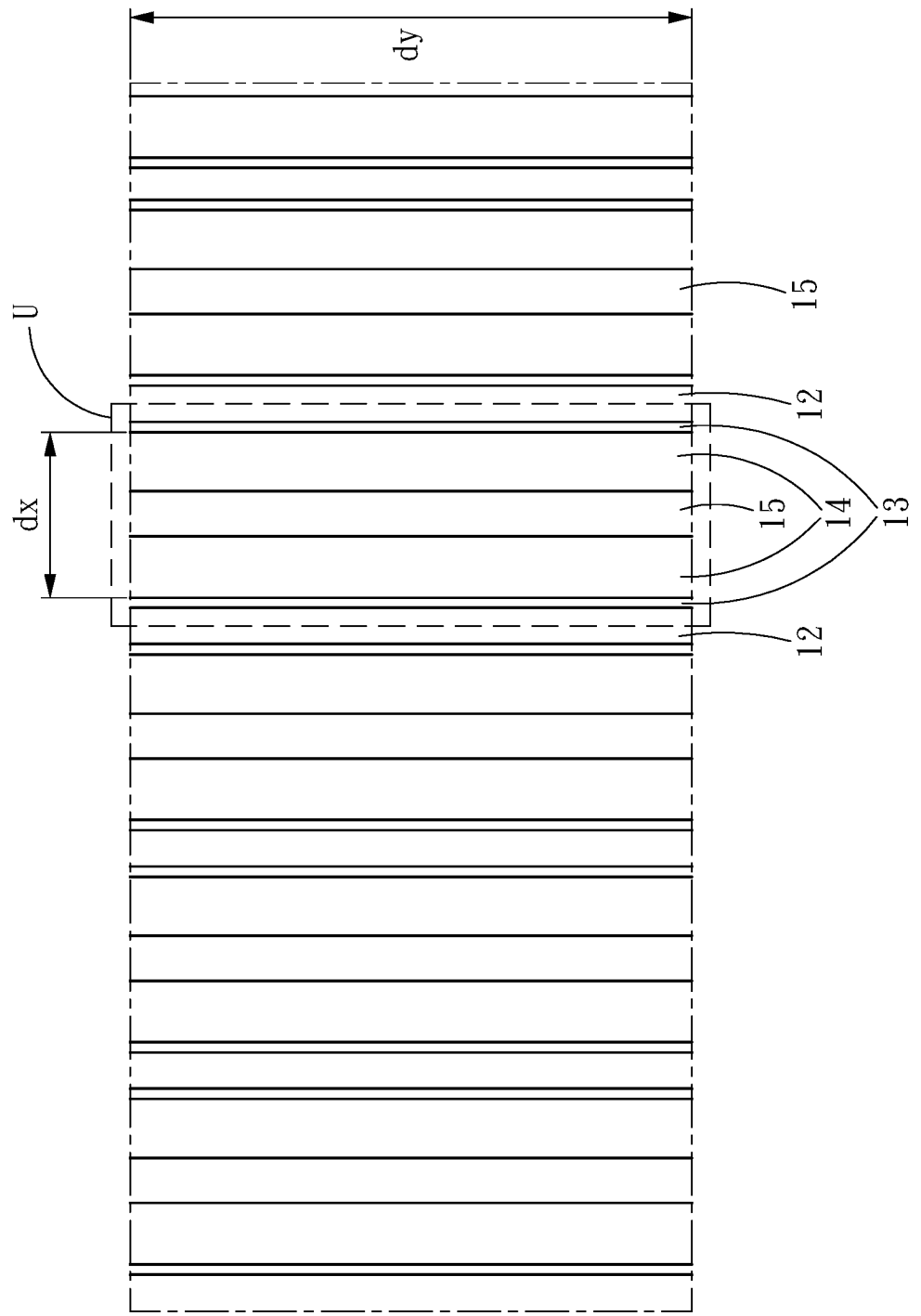
FIG. 3 is a schematic view of a silicon carbide semiconductor device.

FIG. 3 is a schematic view of the silicon carbide semiconductor device 1, wherein FIG. 3 illustrate the top view through the line A-A' of the silicon carbide semiconductor device 1 shown in FIG. 1. Referring to FIG. 3, FIG. 3 illustrates a portion of the active region (A) showing only the pw regions 13, the n+ regions 14 and the p+ regions 15 with stripe cell layout, which is the repeating of unit cell (U). The specific channel resistance $r_{ch,sp}$ can be written as shown in equation 4.

$$r_{ch,sp} = R_{ch} * A_{cell} = \frac{A_{cell}}{W_{ch}} \frac{L_{ch}}{\mu_n C_{ox}(V_{GS} - V_{th})} \quad \text{(equation 4)}$$

In equation 4, $A_{cell}$ is the area of the unit cell (U).

$$D_{ch} = \frac{W_{ch}}{A_{cell}} \quad \text{(equation 5)}$$

As shown in equation 5, $D_{ch}$ is the channel width density. It is apparent that increasing $D_{ch}$ by packing more channel width into a unit cell reduces $r_{ch,sp}$ according to equation 4. For example, as shown in FIG. 3, the channel width density $D_{ch}$ of stripe unit cell is written as equation 5.1.

$$D_{ch} = \frac{W_{ch}}{A_{cell}} = \frac{2 * dy}{dx * dy} = \frac{2}{dx} \quad \text{(equation 5.1)}$$

If the pitch of unit cell (dx) along the X direction of stripe cell layout is reduced from 10 μm to 8 μm, according to equation 5.1, the channel width density $D_{ch}$ will increase from 0.2 μm$^{-1}$ to 0.25 μm$^{-1}$, or an increase of 25%.

Reducing cell pitch requires more precise process control with higher resolution photolithography (light source of shorter wavelength), however, because of the shorter wavelength light source also has smaller depth of focus, given the typically worse wafer shape (larger local thickness variations and BOW/WARP) of SiC compared to Si, pushing the limit of minimizing cell pitch usually accompanies with a large parameter variations and low yield.

Figure 4:
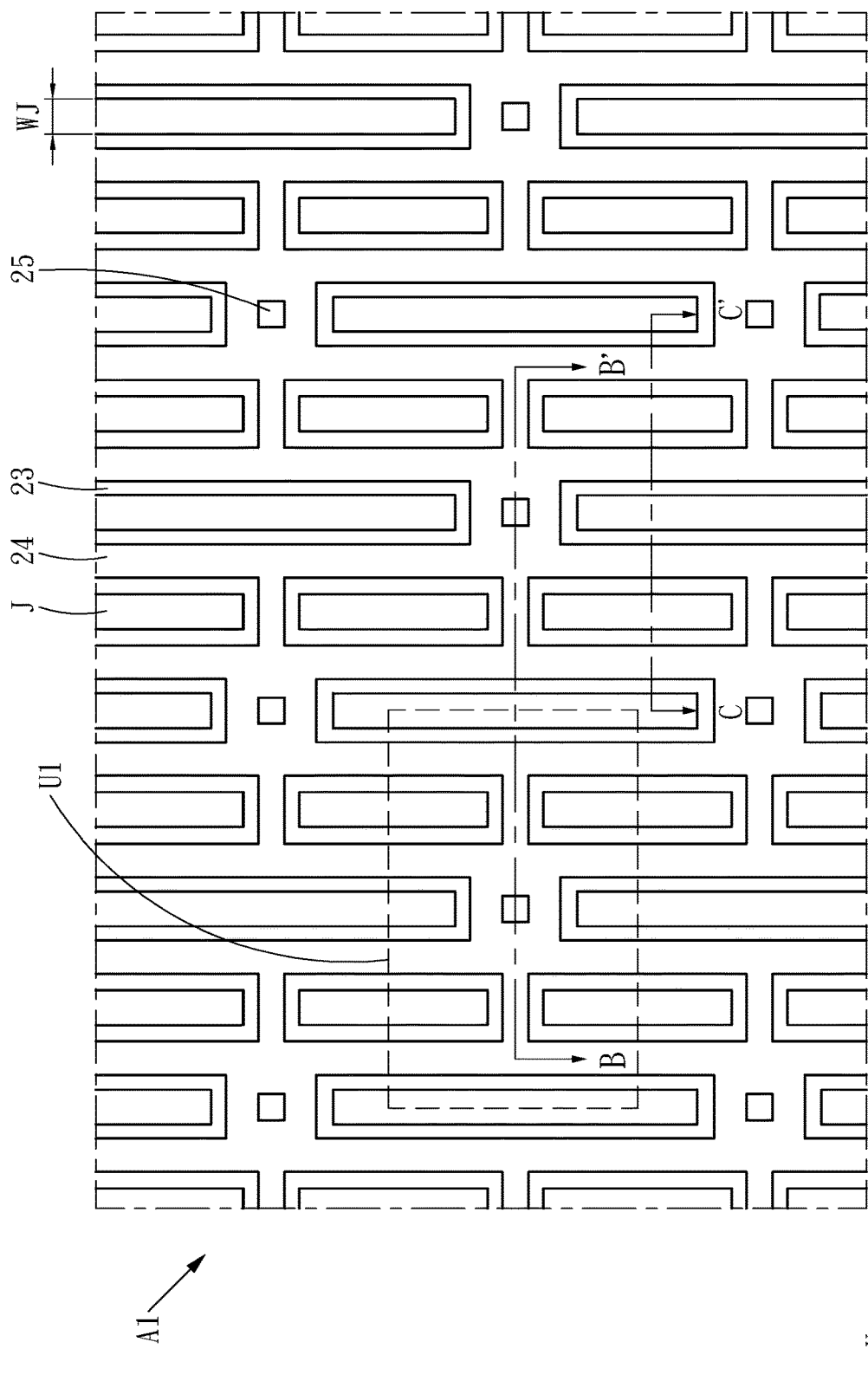
FIG. 4 is a schematic view of a silicon carbide semiconductor device in accordance with an embodiment of the present disclosure.

FIG. 4 is a schematic view of a silicon carbide semiconductor device 2 in accordance with an embodiment of the present disclosure. Referring to FIG. 4, FIG. 4 is a top view of a portion of an active region (A1) of the silicon carbide semiconductor device 2 shown in FIG. 1 and FIG. 2. In the embodiment, FIG. 4 shows a first doped region 23 of a second conductivity type, a second doped region 24 of a first conductivity type opposite to the second conductivity type and a plurality of third doped regions 25 of the second conductivity type. The silicon carbide semiconductor device 2 of the embodiment has a similar structure and function as the silicon carbide semiconductor device 1 shown in FIG. 1 and FIG. 2.

The embodiment shown in FIG. 4 is different from the silicon carbide semiconductor device 1 shown in FIG. 3 in that the active region (A1) of the silicon carbide semiconductor device 2 includes a plurality of repeating unit cells (U1).

Figure 5B:
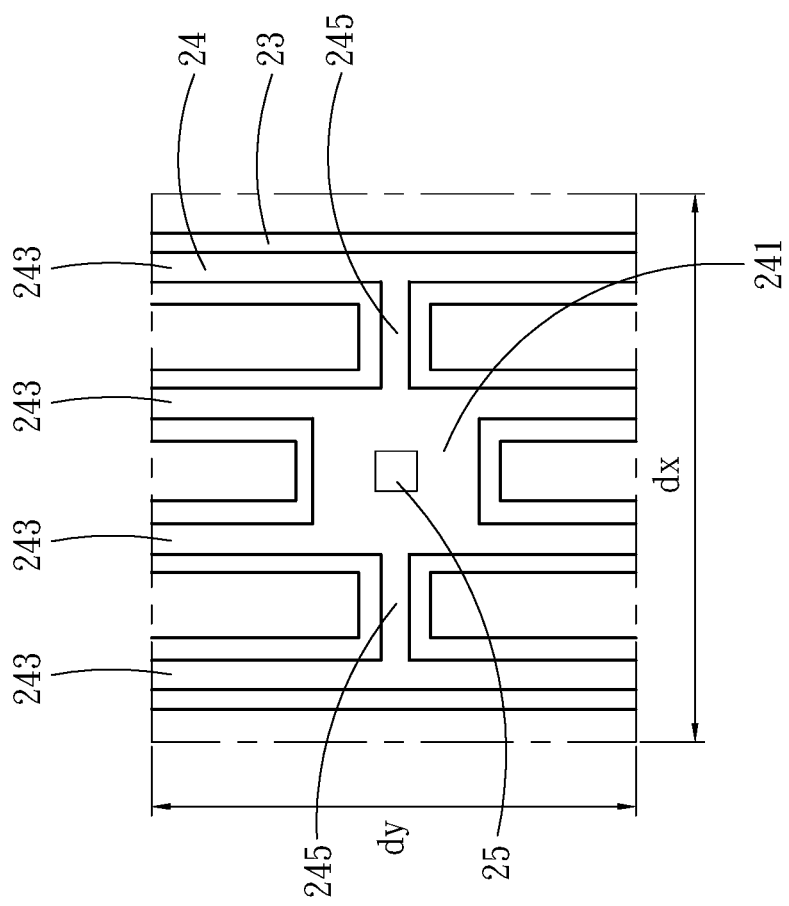
FIG. 5B is a schematic view of a silicon carbide semiconductor device in accordance with an embodiment of the present disclosure.
Figure 5A:
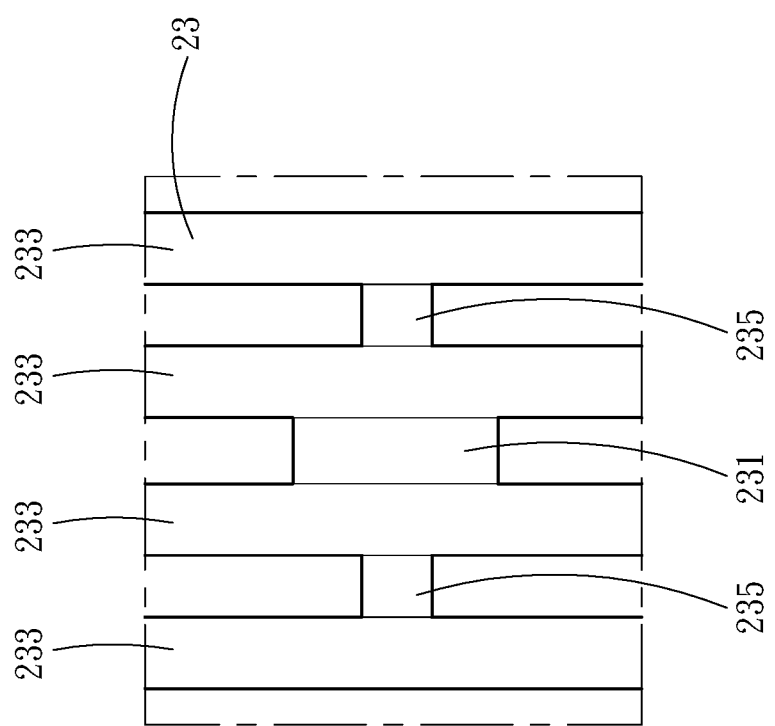
FIG. 5A is a schematic view of a silicon carbide semiconductor device in accordance with an embodiment of the present disclosure.

Also referring to FIG. 5A, FIG. 5A shows only the first doped region 23, which includes a body portion 231, four first leg portions 233, and two first arm portions 235. The first leg portions 233 are disposed along a second direction in the unit cell (U1), and the second direction is the Y direction in the embodiment. The first arm portions 235 are disposed along a first direction in the unit cell (U1), and the first direction is the X direction in the embodiment.

Also referring to FIG. 5B, FIG. 5B shows the first doped region 23, the second doped region 24 and the third doped region 25. The second doped region 24 includes a source portion 241, four second leg portions 243 and two second arm portions along 245. The second leg portions 243 are disposed along the second direction (Y direction), the second arm portions are disposed along the first direction (X direction), and the source portion 241 is disposed in the body region 231 adjacent to the third doped region 25 in the unit cell (U1).

In one embodiment, a cell pitch (dx) along the first direction (X direction) is 20 μm, and the cell pitch (dy) along the second direction (Y direction) is 18 μm.

In the embodiment, the total channel width (not shown) in the unit cell (U1) is 132.8 μm, which results in a channel width density of 0.369 μm$^{-1}$ or an increase of 84.5%, compared to the stripe cell layout as shown in the description of FIG. 3 while using the same design rule. The specific channel resistance $r_{ch,sp}$ will almost be reduced by half. The cell pitch of the silicon carbide semiconductor device 1 as shown in the description of FIG. 3 would have to be reduced from 10 μm to 5.4 μm to achieve the same channel width density of the silicon carbide semiconductor device 2 shown in FIG. 4. The channel width and the channel length can be taught in the description of FIG. 3, and details are not described again.

Figure 6A:
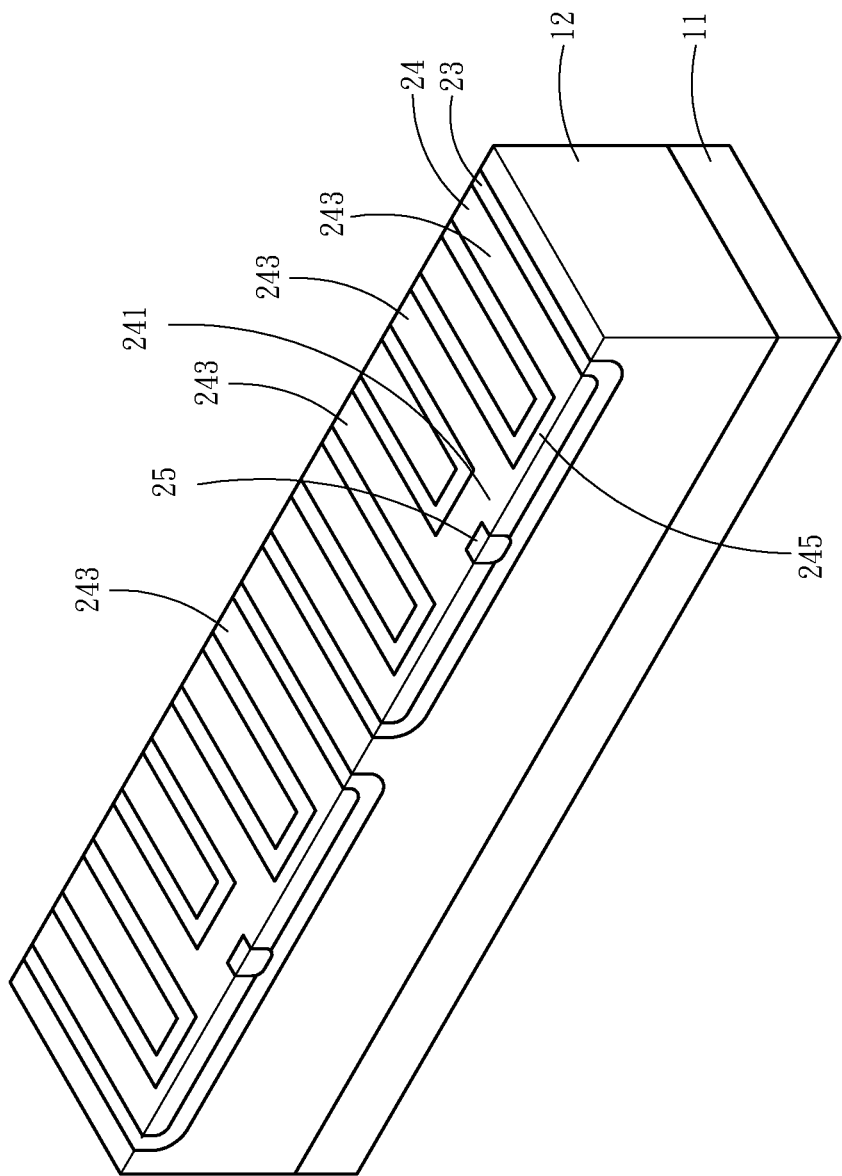
FIG. 6A is a schematic view of a silicon carbide semiconductor device in accordance with an embodiment of the present disclosure.
Figure 6B:
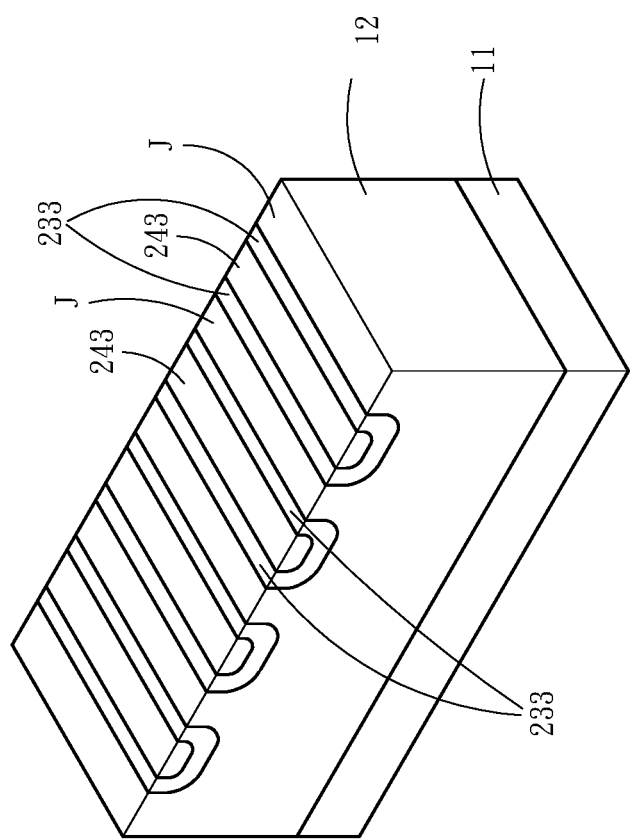
FIG. 6B is a schematic view of a silicon carbide semiconductor device in accordance with an embodiment of the present disclosure.
Figure 6B:
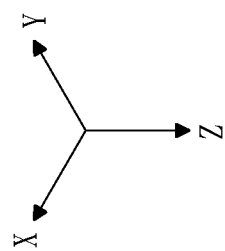

Also referring to FIG. 6A and FIG. 6B, FIG. 6A and FIG. 6B illustrate the cross-sectional views of the silicon carbide semiconductor device 2 shown in FIG. 4 along the B-B' and the C-C' lines. The substrate 11 and the drift layer 12 could be taught by the silicon carbide semiconductor device 1 shown in FIG. 1.

In one embodiment, the first conductivity type is n-type, the second conductivity type is p-type and the conductivity type of the substrate 11 of the silicon carbide semiconductor device 2 is n-type, and the silicon carbide semiconductor device 2 is arranged as a metal oxide semiconductor field effect transistor (MOSFET).

In one embodiment, the first conductivity type is n-type, the second conductivity type is p-type and the conductivity type of the substrate 11 of the silicon carbide semiconductor device 2 is p-type, and the silicon carbide semiconductor device 2 is arranged as an insulated gate bipolar transistor (IGBT).

In one embodiment of the present disclosure, the polytype of the drift layer 12 and the substrate 11 is 4H (4H—SiC). The substrate 11 is n-type, heavily doped by nitrogen with a resistivity of about 0.02 Ω·cm, and a thickness of the substrate 11 is about 350 µm. The drift layer 12 is n-type, in-situ doped with nitrogen and grown by epitaxial process with a thickness of 5 µm and a doping concentration of $1\times10^{16}$ $cm^{-3}$. Between the substrate 11 and the drift layer 12, a buffer layer (not shown) is provided with a thickness of about 0.5 µm to 1 µm and a doping concentration between $1\times10^{17}$ $cm^{-3}$ to $1\times10^{18}$ $cm^{-3}$. The buffer layer may be used to reduce certain types of defects transferring from the substrate 11. The first doped region 23 is formed by multiple ion-implantations of Aluminum into the drift layer 12.

In one embodiment, the dose and energy are adjusted to form a gradient doping profile with a 0.8 µm maximum depth and a $2\times10^{18}$ $cm^{-3}$ peak doping concentration in the bottom portion of the first doped region 23. A plurality of JFET regions (J) are formed between the first doped region 23 as can be seen from FIG. 4 and FIG. 6B. Specifically speaking, the JFET regions could be regarded as surrounded by the first p-n junction formed between the p-type first doped region 23 and the n-type drift layer 12.

In one embodiment, the width WJ (shown in FIG. 4) of the JFET regions (J) is 2.4 µm. The second doped region 24 is formed by multiple ion implantations of phosphorus in the first doped region 23, with a doping concentration preferably higher than $1\times10^{19}$ $cm^{-3}$ to facilitate a low n+ region resistance and low contact resistance with the source electrode 111 (shown in FIG. 1). A second p-n junction is formed between the n-type second doped region 24 and the p-type first doped region 23. A plurality of channel regions 16 (shown in FIG. 1) adjoining the upper surface of the first doped region 23, are defined by the first p-n junction and the second p-n junction.

In one embodiment, the channel length ($L_{ch}$) is 0.5 µm as defined by photomasks or physical dimensions of processes such as self-aligned spacers. The real effective channel length as defined by the first p-n junction and the second p-n junction may vary depending on the process variations and the relative doping concentrations of the drift layer 12, the first doped region 23 and the second doped region 24. The channel width (not shown) used for calculations is also defined by photomasks or physical dimensions of processes such as self-aligned spacers. The real effective channel width as defined by the dimension of the first p-n junction at the upper surface 131 may vary depending on the process variations and the relative doping concentrations of the drift layer 12 and the first doped region 23. The third doped regions 25 are formed by multiple ion implantations of Aluminum in the first doped region 23 adjacent to the second doped region 24 with a doping concentration preferably higher than $1\times10^{19}$ $cm^{-3}$.

In one embodiment, the third doped regions 25 are provided shallower than the first doped region 23. In another embodiment, the third doped regions 25 are provided deeper than the first doped region 23.

The gate insulator 17 (shown in FIG. 1) is formed by thermal oxidation and annealing of the upper surface 131 of the drift layer 12 in the ambient including nitric oxide (NO), nitrous oxide ($N_2O$), nitrogen ($N_2$), oxygen ($O_2$), water ($H_2O$) or hydrogen ($H_2$), to provide interface state density (Dit) to be around or lower than $2\times10^{11}$ $eV^{-1}cm^2$. The gate electrode 115 (shown in FIG. 1) is provided by the deposition of degenerate poly silicon (poly-Si).

In one embodiment, the thickness of gate insulator 17 is 50 nm, the poly-Si is n-type. In another embodiment, the poly-Si is p-type.

A plurality of source contact regions (not shown) and a plurality of gate contact regions (not shown) are formed after etching through an interlayer dielectric used to provide isolation between the gate electrode 115 and the source electrode 111 (shown in FIG. 1), to provide electric contact of the source electrode 111 to the source portions of the second doped region 24 and the third doped regions 25.

In one embodiment, nickel (Ni) is first deposited in those contact regions, annealed by rapid thermal annealing (RTA) into nickel silicides ($Ni_xSi_y$) to form Ohmic contacts with the source portions 241 of the second doped region 24 and the third doped regions 25, and then a thick AlCu is deposited into the gate contact regions contacting the poly-Si and the source contact regions contacting the nickel silicides and arranged as separate gate electrode 115 and source electrode 111. The bottom of the substrate 11 can be, for example, thinned by mechanical polishing to a thickness of 100 µm, deposited with a metal layer (not shown) comprising nickel (Ni) and molybdenum (Mo) and then annealed by lasers to form Ohmic contacts at the backside, followed by the deposition of thick metal layer comprising titanium (Ti), Ni, silver (Ag) or gold (Au), and arranged as the drain electrode 113 (shown in FIG. 1).

Figure 7:
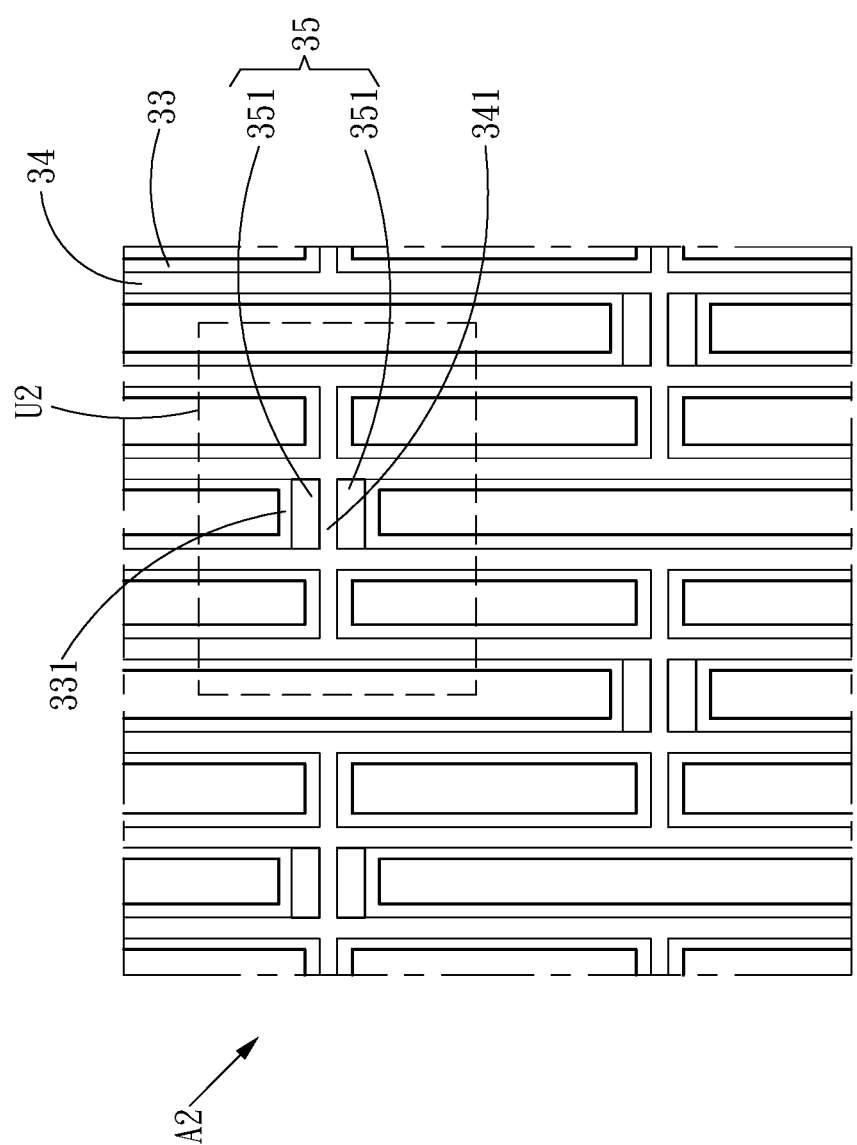
FIG. 7 is a schematic view of a silicon carbide semiconductor device in accordance with another embodiment of the present disclosure.

FIG. 7 is a schematic view of a silicon carbide semiconductor device 3 in accordance with another embodiment of the present disclosure. Referring to FIG. 7, FIG. 7 is a top view illustrating a portion of an active region (A2) of the silicon carbide semiconductor device 3. The silicon carbide semiconductor device 3 includes a first doped region 33 of a second conductivity type, a second doped region 34 of a first conductivity type opposite to the second conductivity type and a plurality of third doped regions 35 of the second conductivity type. The silicon carbide semiconductor device 3 of the embodiment has a similar structure and function as the silicon carbide semiconductor device 2 shown in FIG. 4. The other elements of the silicon carbide semiconductor device, including a gate insulator, a gate electrode and a source electrode, are omitted in FIG. 7 to better illustrate the idea of present disclosure. The active region (A2) of the silicon carbide semiconductor device 3 includes a plurality of repeating unit cells (U2).

The embodiment shown in FIG. 7 is different from the embodiment shown in FIG. 4 in that a source portion 341 of the second doped region 34 is sandwiched by two separate sub-regions 351 of the third doped region 35, and the channel width is therefore zero for the body portion 331. Compare to embodiment shown in FIG. 4, where the third doped region 25 is surrounded by the source portion 241 of the second doped region 24 in the body portion 231 of the first doped region 23.

In the embodiment, the layout sacrifices some channel width but increases the path of current flowing to the source electrode to improve to the short-circuit withstand capability.

In one embodiment, a cell pitch (dx) (not shown) along the first direction (X direction) is 20 μm, and the cell pitch (dy) (not shown) along the second direction (Y direction) is 18 μm. The cell pitch (dx) and the cell pitch (dy) can be taught in the description of FIG. 4, and details are not described again.

In the embodiment, the total channel width (not shown) in the unit cell (U2) is 128 μm, which results in a channel width density of 0.356 μm$^{-1}$ or an increase of 77.8% compared to the stripe cell layout as shown in the description of FIG. 3 while using the same design rule. The channel width and the channel length can be taught in the description of FIG. 3, and details are not described again.

Figure 8:
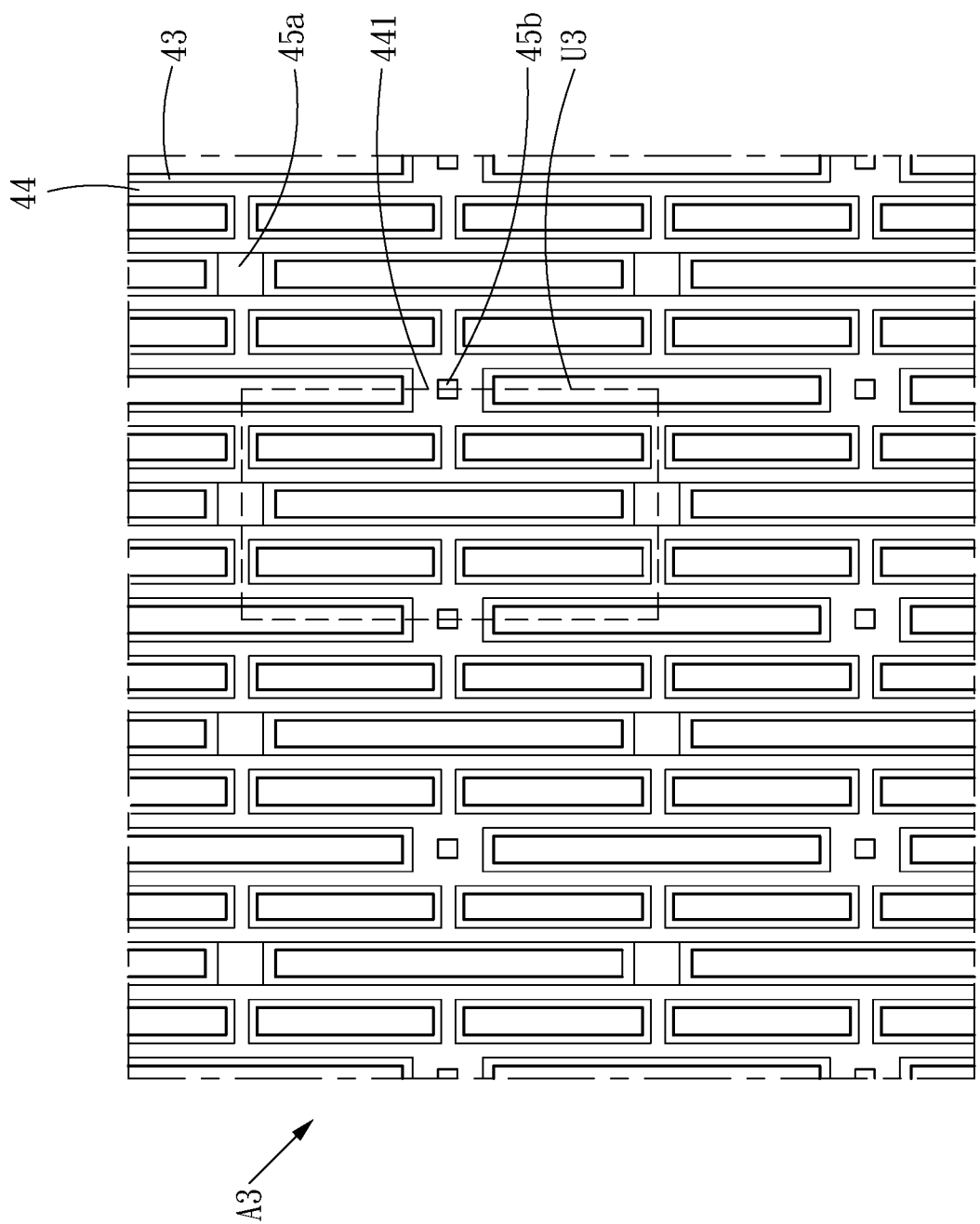
FIG. 8 is a schematic view of a silicon carbide semiconductor device in accordance with still another embodiment of the present disclosure.

FIG. 8 is a schematic view of a silicon carbide semiconductor device 4 in accordance with still another embodiment of the present disclosure. Referring to FIG. 8, FIG. 8 is a top view illustrating a portion of an active region (A3) of the silicon carbide semiconductor device 4. The silicon carbide semiconductor device 4 includes a first doped region 43 of a second conductivity, a second doped region 44 of a first conductivity opposite to the second conductivity and a plurality of third doped regions 45 of the second conductivity. The silicon carbide semiconductor device 4 of the embodiment has a similar structure and function as the silicon carbide semiconductor device 2 shown in FIG. 4. The other elements of the silicon carbide semiconductor device, including a gate insulator, a gate electrode and a source electrode, are omitted in FIG. 8 to better illustrate the idea of present disclosure. The active region (A3) of the silicon carbide semiconductor device 4 includes of a plurality of repeating unit cells (U3).

The embodiment shown in FIG. 8 is different from the embodiment shown in FIG. 4 in that the third doped regions 45a, 45b have two different sizes, and only the smaller third doped regions 45b are provided adjacent to the source portions 441 of the second doped region 44.

Compare to embodiment shown in FIG. 4, where all of the third doped regions 25 of the silicon carbide semiconductor device 2 have the same size and are all adjacent to the second doped region 24.

In the embodiment, the layout of this embodiment sacrifices some channel width but increases the area of the third doped regions 45 contacting the source electrode is to improve the avalanche energy and the forward voltage drop of intrinsic body diode of SiC MOSFET.

In one embodiment, a cell pitch (dx) (not shown) along the first direction (X direction) is 10 μm, and the cell pitch (dy) (not shown) along the second direction (Y direction) is 36 μm. The cell pitch (dx) and the cell pitch (dy) can be taught in the description of FIG. 4, and details are not described again.

In the embodiment, the total channel width (not shown) in the unit cell (U) is 128 μm, which results in a channel width density of 0.356 μm$^{-1}$ or an increase of 77.8% compared to the stripe cell layout as shown in the description of FIG. 3 while using the same design rule. The channel width and the channel length can be taught in the description of FIG. 3, and details are not described again.

Figure 9:
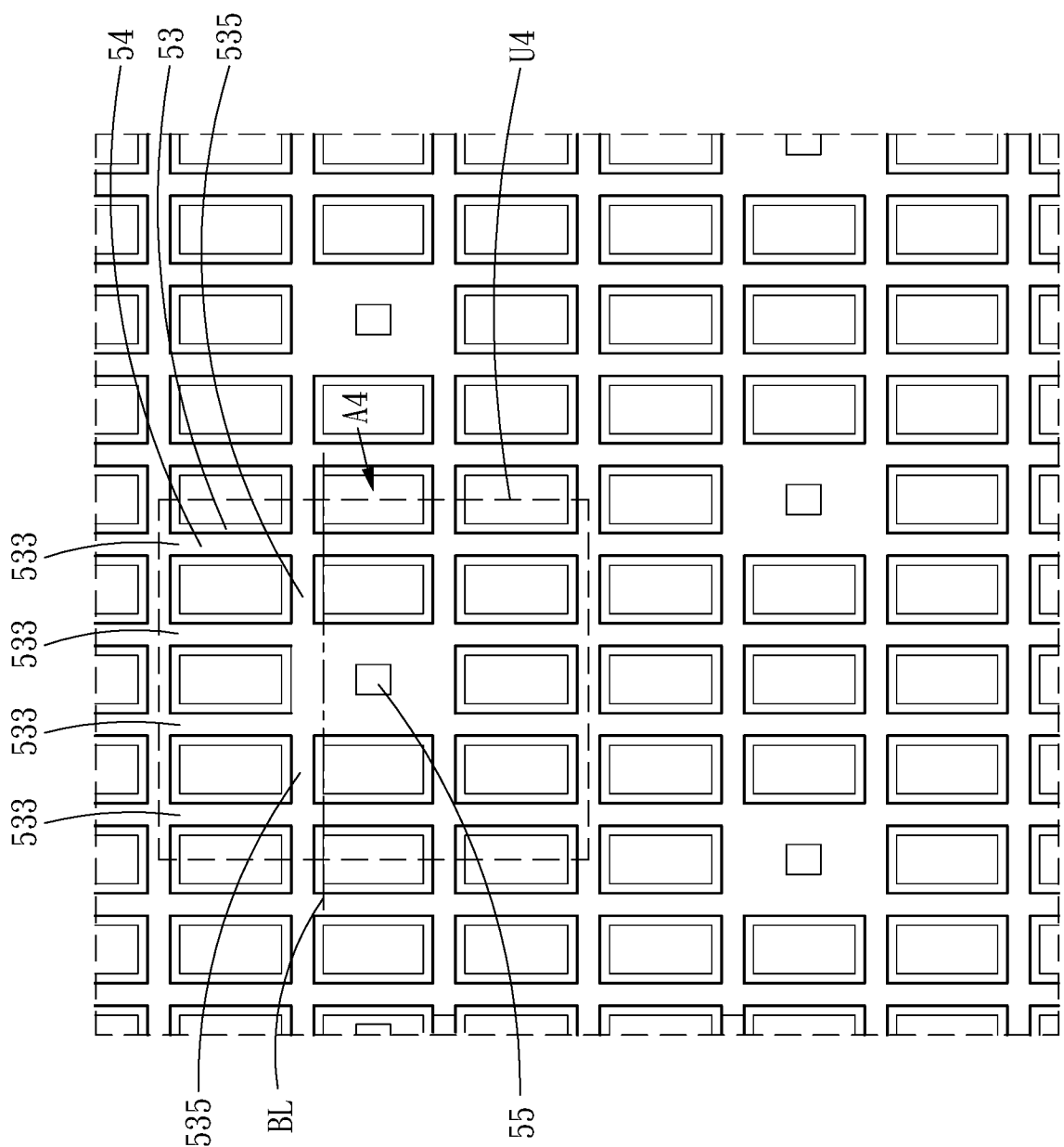
FIG. 9 is a schematic view of a silicon carbide semiconductor device in accordance with still another embodiment of the present disclosure.

FIG. 9 is a schematic view of a silicon carbide semiconductor device 5 in accordance with still another embodiment of the present disclosure. Referring to FIG. 9, FIG. 9 is a top view illustrating a portion of an active region (A4) of the silicon carbide semiconductor device 5. The silicon carbide semiconductor device 5 includes a first doped region 53 of a second conductivity type, a second doped region 54 of a first conductivity type opposite to the second conductivity type and a plurality of third doped regions 55 of the second conductivity type. The silicon carbide semiconductor device 5 of the embodiment has a similar structure and function as the silicon carbide semiconductor device 2 shown in FIG. 4. The other elements of the silicon carbide semiconductor device, including a gate insulator, a gate electrode and a source electrode, are omitted in FIG. 9 to better illustrate the idea of present disclosure. The active region (A4) of the silicon carbide semiconductor device 5 includes a plurality of repeating unit cells (U4).

The embodiment shown in FIG. 9 is different from the embodiment shown in FIG. 4 in that the first leg portions 533 connecting to the first arm portions 535 for both sides, and the opposite sides of the first arm portions 535 connecting to the same first leg portions 533 are aligned to a same baseline (BL).

Compare to the embodiment shown in FIG. 4, where in the silicon carbide semiconductor device 2, the first leg portions 233 are connected to the body portions 231 only on one side and connecting to the first arm portions 235 only on the other side.

In one embodiment, a cell pitch (dx) (not shown) along the first direction (X direction) is 17.6 μm, and the cell pitch (dy) (not shown) along the second direction (Y direction) is 21 μm. The cell pitch (dx) and the cell pitch (dy) can be taught in the description of FIG. 4, and details are not described again.

In the embodiment, the total channel width (not shown) in the unit cell (U1) is 162.8 μm, which results in a channel width density of 0.440 μm$^{-1}$ or an increase of 93.4% compared to the stripe cell layout as shown in the description of FIG. 3 while using the same design rule. The channel width and the channel length can be taught in the description of FIG. 3, and details are not described again.

Figure 10B:
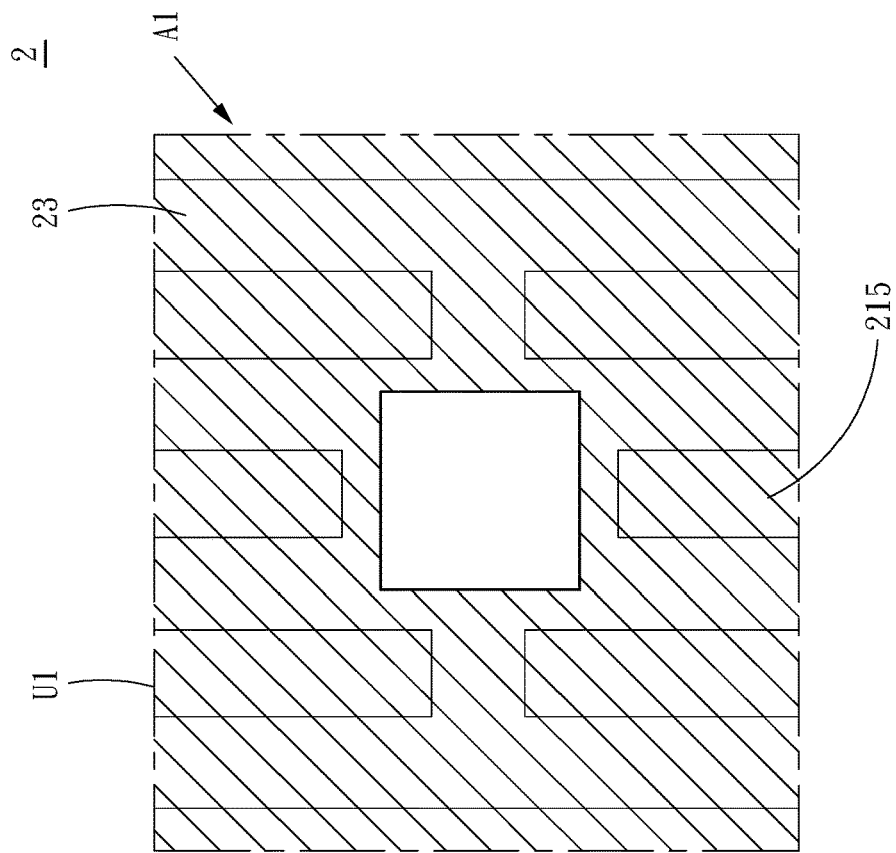
FIG. 10B is a schematic view of a silicon carbide semiconductor device in accordance with another embodiment of the present disclosure.
Figure 10A:
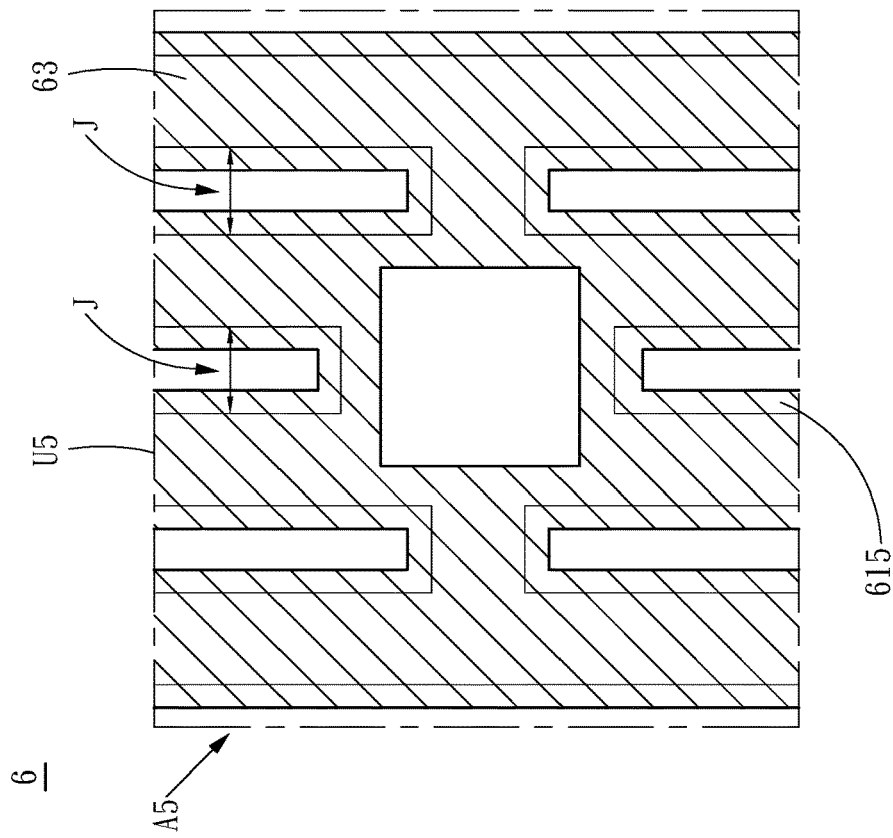
FIG. 10A is a schematic view of a silicon carbide semiconductor device in accordance with still another embodiment of the present disclosure.

FIG. 10A is a schematic view of a silicon carbide semiconductor device 6 in accordance with still another embodiment of the present disclosure. Referring to FIG. 10A, FIG. 10A is a top view illustrating a repeating unit cell (U5) of an active region (A5) of the silicon carbide semiconductor device 6. The silicon carbide semiconductor device 6 illustrates a first doped region 63, a plurality of JFET regions (J) and a gate electrode 615. The active region (A5) of the silicon carbide semiconductor device 6 includes a plurality of repeating unit cells (U6).

Also referring to FIG. 10B, FIG. 10B is a schematic view of the silicon carbide semiconductor device 2 shown in FIG. 4. FIG. 10B is a top view illustrating the repeating unit cell (U1) of the active region (A1) of a silicon carbide semiconductor device 2. FIG. 10B illustrates the first doped region 23, and a gate electrode 215. The silicon carbide semiconductor device 6 shown in FIG. 10A has a similar structure and function as the silicon carbide semiconductor device 2 shown in FIG. 10B.

The embodiment shown in FIG. 10A is different from the embodiment shown in FIG. 4 and FIG. 10B in that the gate electrode 615 of the silicon carbide semiconductor device 6 is not contacting the gate insulator above a part of the JFET regions (J).

In the silicon carbide semiconductor device 6, the reduced area of the gate electrode 615 contacting the gate insulator improves the input capacitance and output capacitance of the silicon carbide semiconductor device 6 and enables faster switching and lower switching loss.

In one embodiment, a cell pitch (dx) (not shown) along the first direction (X direction) is 20 μm, and the cell pitch (dy) (not shown) along the second direction (Y direction) is 18 μm. The cell pitch (dx) and the cell pitch (dy) can be taught in the description of FIG. 4, and details are not described again.

In the embodiment, the total channel width (not shown) in the unit cell (U1) is 132.8 μm, which results in a channel width density of 0.369 μm$^{-1}$ or an increase of 84.5% compared to the stripe cell layout as shown in the description of FIG. 3 while using the same design rule. The results are same as the silicon carbide semiconductor device 2 illustrated in FIG. 4 and FIG. 10B. The channel width and the channel length can be taught in the description of FIG. 3, and details are not described again.

Figure 11:
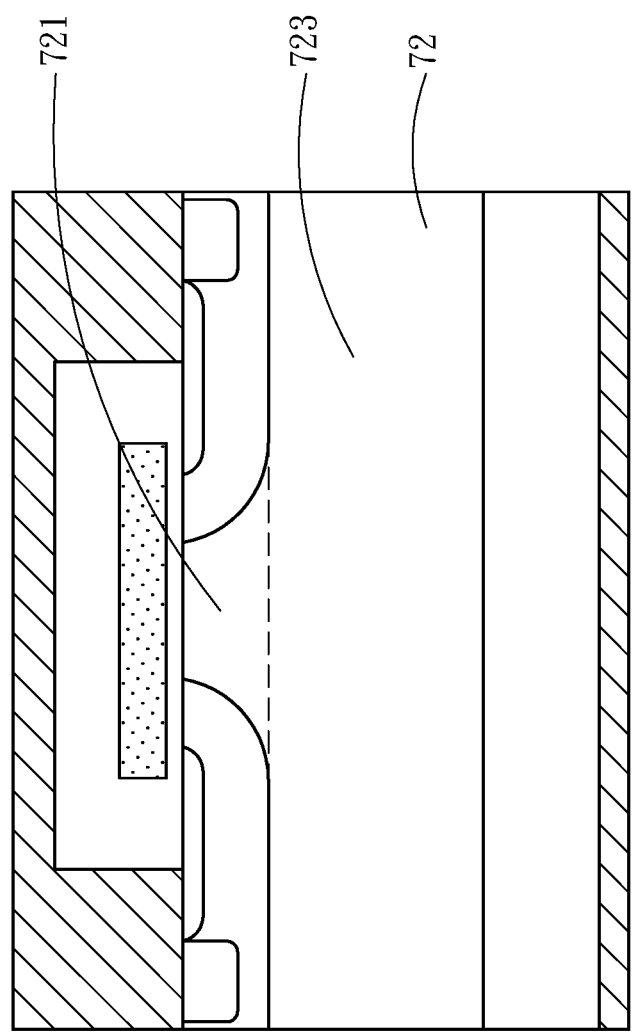
FIG. 11 is a schematic view of a silicon carbide semiconductor device in accordance with still another embodiment of the present disclosure.

FIG. 11 is a schematic view of a silicon carbide semiconductor device 7 in accordance with still another embodiment of the present disclosure. Referring to FIG. 11, FIG. 11 is a cross-sectional view illustrating the silicon carbide semiconductor device 7. The silicon carbide semiconductor device 7 of the embodiment has a similar structure and function as the silicon carbide semiconductor device 2 shown in FIG. 4. The embodiment shown in FIG. 11 is different from the embodiment shown in FIG. 4 in that a drift layer 72 further includes an upper portion 721 and a lower portion 723. The upper portion 721 has a doping concentration higher than a doping concentration of the lower portion 723.

In one embodiment, a cell pitch (dx) (not shown) along the first direction (X direction) is 14.4 μm, and the cell pitch (dy) (not shown) along the second direction (Y direction) is 18 μm. The cell pitch (dx) and the cell pitch (dy) can be taught in the description of FIG. 4, and details are not described again.

In the embodiment, the width of JFET regions (J) defined by the photomasks or implantation hardmasks is 1 μm. The drift layer 72 has a 1×10$^{16}$ cm$^{-3}$ doping concentration, and the first doped region 73 has a 2×10$^{18}$ cm$^{-3}$ peak doping concentration. The width of depletion region extended from the first doped region 73 into the drift layer 72 for one side is estimated to be 567 nm, and the total depletion width for both sides of the JFET regions (J) will be 1,134 nm which pitches off the JFET regions (J) to either completely prevent the current from conducting or increase the JFET resistance of the silicon carbide semiconductor device to a level unacceptable. Therefore, the doping concentration of the upper portion 721 of the drift layer 72 has to be increased to, for example, 1×10$^{17}$ reducing the depletion width to 177 nm to lower the JFET resistance.

In the embodiment, the thickness of the upper portion 721 of the drift layer 72 is preferably adjusted close to the depth the first doped region 73. For example, with a 0.8 μm depth of the first doped region 73. In one embodiment, the thickness of the upper portion 721 is arranged as 0.7 μm. In another embodiment, the thickness of the upper portion 721 is arranged as 1.0 μm.

The upper portion 721, for example, could be provided by multiple ion implantations of nitrogen or phosphorus, or the upper portion 721 could be provided by epitaxial processes.

In the embodiment, the total channel width (not shown) in the unit cell (U) is 124.4 μm, which results in a channel width density of 0.48 μm$^{-1}$, or an increase of 72.7% compared to a channel width density of 0.278 μm$^{-1}$ of stripe cell layout as illustrated in FIG. 3 while using the same design rule. The channel width and the channel length can be taught in the description of FIG. 3, and details are not described again.

In the embodiment, a higher channel width density is implemented with tighter rules. The present disclosure can achieve a higher channel width density than conventional cell layout such as stripe cell layout with relatively loose design rules, the present disclosure is also scalable to further increase channel width density by tightening design rules as the materials and processes being improved.

Figure 12:
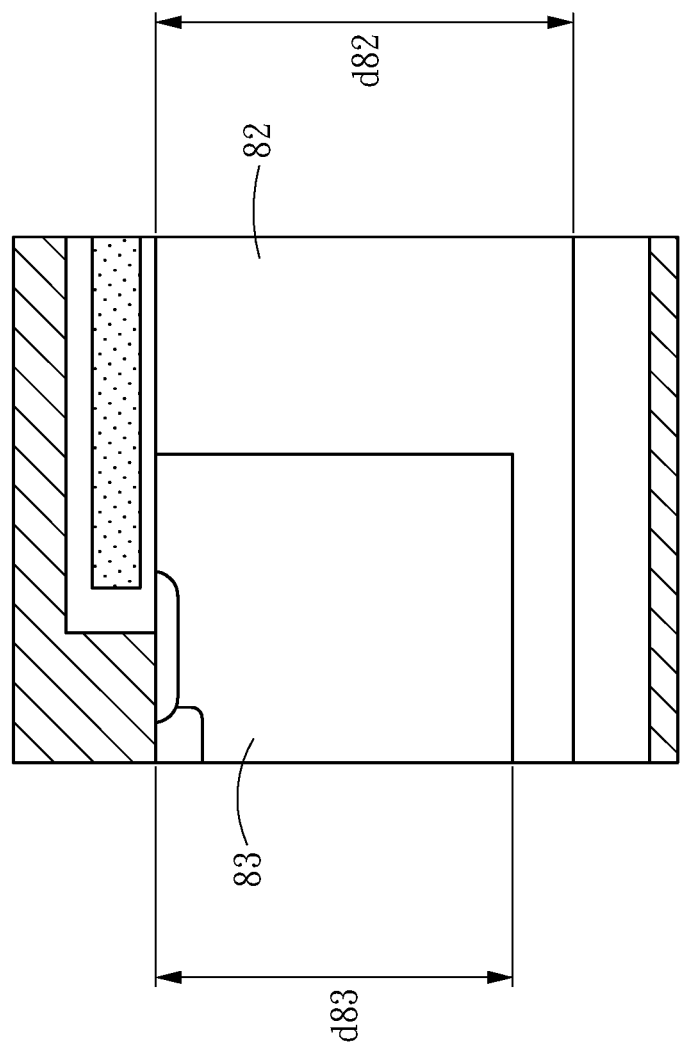
FIG. 12 is a schematic view of a silicon carbide semiconductor device in accordance with still another embodiment of the present disclosure.

FIG. 12 is a schematic view of a silicon carbide semiconductor device 8 in accordance with still another embodiment of the present disclosure. Referring to FIG. 12, FIG. 12 is a cross-sectional view illustrating the silicon carbide semiconductor device 8. The silicon carbide semiconductor device 8 of the embodiment has a similar structure and function as the silicon carbide semiconductor device 2 shown in FIG. 4. The embodiment shown in FIG. 12 is different from the embodiment shown in FIG. 4 in that a first doped region 83 of the silicon carbide semiconductor device 8 is provided with a depth d83 which is equal to or larger than half of the drift layer 82 thickness d82.

In one embodiment, for example, the drift layer 82 has a thickness of 10 μm and a doping concentration of 3×10$^{16}$ cm$^{-3}$. The first doped region 83 has a maximum depth of 6 μm and a doping concentration of 6×10$^{16}$ cm$^{-3}$. The width of the first doped regions 83 and the JFET regions (J) are arranged to ensure the charge balance between the p-type pillar of the first doped region 83 and the n-type drift layer 82.

In the embodiment, the structure of the silicon carbide semiconductor device 8 is also known as super junction, which can increase the doping concentration of the drift layer 82 to a higher level while maintain the required blocking voltage by manipulating the shape of electric field profile, and can be used to combined with the present disclosure to further reduce the specific on-resistance of the silicon carbide semiconductor device 8.

In summary, according to the silicon carbide semiconductor device of the embodiment of the disclosure, by setting a first doped region including a plurality of first leg portions, a plurality of body portions, and a plurality of first arm portions, and a second doped region including a plurality of second leg portions, a plurality of source portions, and a plurality of second arm portions, the performance of the silicon carbide semiconductor device could be improved.

What is claimed is:

1. A silicon carbide semiconductor device, comprising:
a drift layer, disposed on a substrate, the drift layer has a first conductivity type and an upper surface, and the drift layer comprises an active region;
a first doped region, disposed in the active region adjoining the upper surface, the first doped region has a second conductivity type opposite the first conductivity type and forms a plurality of first p-n junctions and a plurality of JFET regions with the drift layer, the first doped region comprises a plurality of first leg portions, a plurality of body portions, and a plurality of first arm portions, the plurality of first arm portions are extending along a first direction and connecting at least two of the first leg portions, the plurality of first leg portions are extending along a second direction, and the plurality of body portions connect at least two of the first leg portions;
a second doped region, disposed in the first doped region, the second doped region has the first conductivity type and forms a plurality of second p-n junctions with the first doped region, a plurality of channel regions are defined between the first p-n junctions and the second p-n junctions along the upper surface, the second doped region comprises a plurality of second leg portions, a plurality of source portions, and a plurality of second arm portions, the plurality of second leg portions are extending along the second direction, the plurality of source portions are arranged in the body portions and connecting at least two of the second leg portions, and the plurality of second arm portions are extending along the first direction and connecting at least two of the second leg portions;

a plurality of third doped regions, disposed in the body portions, the plurality of third doped regions have the second conductivity type;

a gate insulator, disposed on the upper surface, and the gate insulator extending over the plurality of JFET regions, the channel regions, and part of the second doped region;

a gate electrode, contacting the gate insulator; and a source electrode, contacting the source portions and the third doped regions, wherein a channel width density of the active region is higher than 0.2 $\mu m^{-1}$.

2. The silicon carbide semiconductor device of claim 1, wherein each of the first leg portions is connected to the plurality of body portions only on one side and connected to the plurality of first arm portions only on the other side.

3. The silicon carbide semiconductor device of claim 1, wherein the third doped regions are disposed adjacent to the source portions in each of the body portions.

4. The silicon carbide semiconductor device of claim 1, wherein the third doped regions comprise a plurality of sub-regions in some of the body portions, and the sub-regions are separated to each other.

5. The silicon carbide semiconductor device of claim 1, wherein the third doped regions have a plurality of sizes, and the third doped regions are adjacent to the source portions in some of the body portions.

6. The silicon carbide semiconductor device of claim 1, wherein the opposite sides of the first arm portions connecting to the same first leg portions are aligned to a same baseline.

7. The silicon carbide semiconductor device of claim 1, wherein the gate electrode is not contacting the gate insulator above a part of the JFET regions.

8. The silicon carbide semiconductor device of claim 1, wherein the drift layer further comprises an upper portion and a lower portion, and the upper portion has a doping concentration higher than a doping concentration of the lower portion.

9. The silicon carbide semiconductor device of claim 1, wherein the first doped region has a first maximum depth in the drift layer, and the first maximum depth is equal to or larger than half of a thickness of the drift layer.

10. The silicon carbide semiconductor device of claim 9, wherein the third doped regions have a second maximum depth larger than the first maximum depth.

11. The silicon carbide semiconductor device of claim 1, wherein a doping concentration of the first doped region close to the upper surface is lower than other portion of the first doped region.

12. The silicon carbide semiconductor device of claim 1, wherein the substrate has the first conductivity type and the silicon carbide semiconductor device is arranged as a metal oxide semiconductor field effect transistor (MOSFET).

13. The silicon carbide semiconductor device of claim 1, wherein the substrate has the second conductivity type and the silicon carbide semiconductor device is arranged as an insulated gate bipolar transistor (IGBT).

* * * * *